(12) United States Patent
Kim et al.

(10) Patent No.: US 8,519,017 B2
(45) Date of Patent: Aug. 27, 2013

(54) RESIN COMPOSITION CONTAINING CATALYST PRECURSOR FOR ELECTROLESS PLATING IN FORMING ELECTRO-MAGNETIC SHIELDING LAYER, METHOD OF FORMING METALLIC PATTERN USING THE SAME, AND METALLIC PATTERN FORMED BY THE SAME METHOD

(75) Inventors: Min Kyoun Kim, Daejeon (KR); Min Jin Ko, Daejeon (KR); Sang Chul Lee, Daejeon (KR); Jeong Im Roh, Daejeon (KR)

(73) Assignee: LG Chem, Ltd., Seoul (KR)

( * ) Notice: Subject to any disclaimer, the term of this patent is extended or adjusted under 35 U.S.C. 154(b) by 759 days.

(21) Appl. No.: 12/600,455

(22) PCT Filed: May 15, 2008

(86) PCT No.: PCT/KR2008/002711
§ 371 (c)(1),
(2), (4) Date: Nov. 16, 2009

(87) PCT Pub. No.: WO2008/140272
PCT Pub. Date: Nov. 20, 2008

(65) Prior Publication Data
US 2010/0167081 A1    Jul. 1, 2010

(30) Foreign Application Priority Data
May 15, 2007   (KR) .................. 10-2007-0047077

(51) Int. Cl.
C08F 2/50       (2006.01)
C08J 3/28       (2006.01)
C05D 9/02       (2006.01)
B01J 31/02      (2006.01)
B01J 31/22      (2006.01)
B01J 31/26      (2006.01)

(52) U.S. Cl.
USPC ........... 522/152; 522/150; 522/153; 522/154; 522/173; 522/181; 522/66; 430/269; 430/270.1; 430/281.1; 430/285.1; 430/322; 430/324; 205/162; 205/167; 205/169; 502/100; 502/104; 502/101; 502/159; 502/169; 502/224; 502/300; 502/344; 502/347

(58) Field of Classification Search
USPC ................. 522/150, 152, 153, 154, 173, 181; 430/269, 270.1, 281.1, 285.1, 322, 324; 205/162, 167, 169; 502/100, 104, 101, 159, 502/169, 224, 300, 344, 347
See application file for complete search history.

(56) References Cited

U.S. PATENT DOCUMENTS 5,041,369 A * 8/1991 Fukui et al. .................... 430/619
5,300,536 A * 4/1994 Takahashi et al. ................ 522/8
(Continued)

FOREIGN PATENT DOCUMENTS

JP    04-207000 A    7/1992
JP    10-223147 A    8/1998
(Continued)

Primary Examiner — Sanza McClendon
(74) Attorney, Agent, or Firm — Rothwell, Figg, Ernst & Manbeck, P.C.

(57) ABSTRACT

A catalyst precursor resin composition includes an organic polymer resin; a fluorinated-organic complex of silver ion; a monomer having multifunctional ethylene-unsaturated bonds; a photoinitiator; and an organic solvent. The metallic pattern is formed by forming catalyst pattern on a base using the catalyst precursor resin composition reducing the formed catalyst pattern, and electroless plating the reduced catalyst pattern. In the case of forming metallic pattern using the catalyst precursor resin composition, a compatibility of catalyst is good enough not to make precipitation, chemical resistance and adhesive force of the formed catalyst layer are good, catalyst loss is reduced during wet process such as development or plating process, depositing speed is improved, and thus a metallic pattern having good homogeneous and micro pattern property may be formed after electroless plating.

14 Claims, 7 Drawing Sheets

(56) References Cited

U.S. PATENT DOCUMENTS

| | | | |
|---|---|---|---|
| 5,939,242 A * | 8/1999 | Tang et al. | 430/329 |
| 6,899,999 B2 * | 5/2005 | Hiraoka et al. | 430/311 |
| 7,378,478 B2 * | 5/2008 | Eu et al. | 526/317.1 |
| 7,378,487 B2 | 5/2008 | Eu et al. | |
| 7,682,774 B2 * | 3/2010 | Kim et al. | 430/281.1 |
| 8,053,540 B2 * | 11/2011 | Eu et al. | 526/317.1 |
| 2003/0022102 A1 * | 1/2003 | Hiraoka et al. | 430/270.1 |
| 2007/0112106 A1 * | 5/2007 | Otsuki | 524/114 |
| 2007/0243363 A1 * | 10/2007 | Kim et al. | 428/195.1 |

FOREIGN PATENT DOCUMENTS

| | | |
|---|---|---|
| JP | 13-337454 A | 12/2001 |
| JP | 2005-353656 A | 12/2005 |
| KR | 10-2005-0013842 A | 2/2005 |
| KR | 10-2007-0101785 A | 10/2007 |
| KR | 10-2007-0102080 A | 10/2007 |
| WO | 2007119966 A1 | 10/2007 |

\* cited by examiner

20μm Mesh pattern (x400)

20μm Mesh Cu Pattern

5μm Mesh pattern (x2.00k)

5μm Mesh pattern (x2.0k)

5μm Mesh pattern (x1.20k)

RESIN COMPOSITION CONTAINING CATALYST PRECURSOR FOR ELECTROLESS PLATING IN FORMING ELECTRO-MAGNETIC SHIELDING LAYER, METHOD OF FORMING METALLIC PATTERN USING THE SAME, AND METALLIC PATTERN FORMED BY THE SAME METHOD

CROSS REFERENCE TO RELATED APPLICATIONS

This application is a 35 U.S.C. §371 National Phase Entry Application from PCT/KR2008/002711, filed May 15, 2008, and designating the United States, which claims priority under 35 U.S.C. §119 to Korean Patent Application No. 10-2007-0047077 filed May 15, 2007, which is incorporated herein in its entirety.

TECHNICAL FIELD

The present invention relates to a resin composition containing catalyst precursor for electroless plating in forming electromagnetic shielding layer, a method of forming metallic pattern using the same, and electromagnetic waves-shielding materials having the metallic pattern formed. More particularly, the present invention relates to a resin composition containing catalyst precursor which has a copolymer and a fluorinated-organic complex of silver ion used in forming metallic pattern for shielding electromagnetic waves, wherein the copolymer has a carboxyl group monomer and a maleimide monomer, a method of forming metallic pattern using the same, a metallic pattern formed by the same method, and electromagnetic waves-shielding materials having the metallic pattern formed.

BACKGROUND ART

In general, various forms of displays have been commercialized recently, and electromagnetic interference (EMI) due to electromagnetic noise occurred in the display causes problems such as harm to human bodies and malfunction of machinery. To solve these problems, there is a method which includes forming a conductive shielding film in front of display, distorting the progressing direction of the electromagnetic waves, and releasing through earthing.

As a method of shielding electromagnetic wave noise occurred in front of display such as CRT, PDP, etc., a method of forming a thin conductive film by vapor-depositing metal or metal oxide on a transparent substrate is known. However, the film must be deposited thinly to provide a transparency, and in this case, surface resistance of conductive layer becomes too high to get a sufficient electromagnetic shielding effect.

The most generally used method is metal foil etching, which includes adhering a thin copper film on a transparent substrate, forming a photoresistor pattern by exposure, and forming a copper pattern by etching the thin copper film using the photoresistor pattern. However, this method has a long and complicated procedure, makes much metal wastes and thus is not good for environment. Further, the method causes a problem, in that nodes of copper pattern bulge during procedures.

In addition to the above mentioned methods, there has been reported a method which includes forming a pattern by printing conductive paste, for example, by screen printing and offset printing, and forming electromagnetic waves-shielding film by electroless plating. This method has a precision limit on printed-circuit board. In addition, the method has a problem that conductive materials sink into uneven parts.

As a photo development method, a method including forming a metal layer, and plating or electroless plating it is disclosed, but this developing method has drawbacks in that several layers and complicated procedures are necessary. Meanwhile, there is reported a method which includes mixing a metal catalyst with photosensitive resin, followed by development, and then electroless plating or electro plating. However, this method uses a precious Pd as a catalyst and it doesn't disclose a solution about the problem like pattern detach in strong alkaline aqueous solution, accompanied by electroless plating. In the case of electroless plating, deposition efficiency might be improved, but a solution about pattern detach in strong alkaline aqueous solution was not disclosed.

DISCLOSURE

Technical Problem

The present invention has been made to solve the foregoing problems with the prior art, and therefore the present invention is directed to a catalyst precursor resin composition having good adhesive and deposit properties, being capable of forming micro pattern having a good pattern property, and having less loss of catalyst during wet processing such as development, electroless plating and the like.

The present invention is also directed to a method of forming metallic pattern using the catalyst precursor resin composition.

The present invention is further directed to metallic pattern formed according to the present method and electromagnetic waves-shielding materials, a flexible print circuit board, components or elements containing the same.

Technical Solution

According to an aspect of the present invention, a catalyst precursor resin composition for forming metallic pattern includes:
(a) A copolymer of a monomer having a carboxyl group and a maleimide monomer having a liposoluble functional group substituted to nitrogen,
(b) A fluorinated-organic complex of a silver ion,
(c) A monomer having multifunctional ethylene-unsaturated bonds,
(d) A photoinitiator, and
(e) An organic solvent.

According to another aspect of the present invention, a method of forming metallic pattern includes:
(a) forming catalyst pattern layer on a substrate using a catalyst precursor resin composition of the present invention;
(b) reducing the formed catalyst pattern layer; and
(c) electroless plating on the reduced catalyst pattern layer.

According to another aspect of the present invention, metallic pattern is provided by a method including:
(a) forming catalyst pattern layer on a substrate using a catalyst precursor resin composition of the present invention;
(b) reducing the formed catalyst pattern layer; and
(c) electroless plating on the reduced catalyst pattern layer.

Further, according to another aspect of the present invention, an electric and/or electronic article comprising metallic pattern can be provided.

Now, the present invention will be disclosed in more detail.

Inventors of the present invention have studied a method of forming metal wiring having simple processes, being capable of forming micro metallic pattern less than 20 µm (micrometer) of line width, and having a good pattern property. We found that, by using a catalyst precursor resin composition composed of a fluorinated-organic complex of silver ion and a copolymer of a monomer having a carboxyl group and a maleimide monomer having a liposoluble functional group substituted to nitrogen, a good chemical resistance and a stable pattern may be obtainable homogeneously in a plating process using a strong alkaline, an adhesive force of the formed catalyst pattern layer is good, a catalyst loss is less during wet processes such as development or plating process, deposition speed may be improved, a compatibility between catalyst precursor, an organic solvent and resin is good enough not to make precipitation and to keep a constant composition, and thus the composition represents a good stability and a good pattern property, homogeneous micro metallic pattern may be possibly formed by electroless plating.

As an embodiment of the present invention, the catalyst precursor resin composition comprises (a) A copolymer of a monomer having a carboxyl group and a maleimide monomer having a liposoluble functional group substituted to nitrogen, (b) A monomer having multifunctional ethylene-unsaturated bonds, (c) A fluorinated-organic complex of silver ion, (d) A photoinitiator, and (e) An organic solvent.

An organic polymer constituting the catalyst precursor resin composition of the present invention, that is, a copolymer should securely have sufficient solubility to alkaline development solution in order to form patterns. Thus, the copolymer prepared comprising a monomer having a carboxyl group is used. Examples of the monomer having a carboxyl group include, but are not limited only to, acrylic acid, methacrylic acid, crotonic acid, itaconic acid, maleinic acid, fumarinic acid, monomethylmaleinic acid, isoprenesulphonic acid, styrenesulphonic acid and 5-norbonene-2-carboxylic acid, and the like. The monomer having a carboxyl group can be used alone or as a mixture of more than two of the above.

Further, as the organic polymer resin constituting the catalyst precursor resin composition of the present invention, copolymer prepared comprising maleimide monomer having a liposoluble functional group on nitrogen is used for chemical resistance and minizing the loss of catalyst precursor.

Examples of the maleimide monomer having a liposoluble functional group on nitrogen include, but are not limited only to, N-ethylmaleimide, N-propylmaleimide, N-methoxycarbonylmaleimide, N-furfurylmaleimide, N-cyclohexylmaleimide, N-butylmaleimide, 2,5-dioxo-3-pyrroline-1-carboxamide, 3,4-dichloromethyl-pyrrole-2,5-dione, N-benzylmaleimide, N-phenylmaleimide, 3-methyl-N-phenylmaleimide, N-(ortho-toyl)-N-phenylmaleimide, N-(4-fluorophenyl)maleimide, N-(2,6-xylyl)maleimide, 3-chloro-1-phenyl-pyrrole-2,5-dione, N-(2-chlorophenyl)-maleimide, N-(1-napthalyl)-maleimide, 1-(2-trifluoromethyl-phenyl)-pyrrole-2,5-dione, and the like. The maleimide monomer having a liposoluble functional group on nitrogen can be used alone or as a mixture of more than two of the above. In particular, as a maleimide monomer having a liposoluble functional group on nitrogen used as a monomer in a copolymer resin contained in a composition of the present invention, in view of chemical resistance, a maleimide monomer having an aromatic functional group on nitrogen is preferable.

The term of 'a copolymer of a monomer having a carboxyl group and a maleimide monomer having a liposoluble functional group substituted to nitrogen' used in the present invention means a copolymer resin formed by polymerization of a monomer having a carboxyl group and a maleimide monomer having a liposoluble functional group substituted to nitrogen. The copolymer resin of this invention is understood also can comprise a copolymer polymered further comprising monomer having polymerizable unsaturated bond, specifically radical polymerizable unsaturated bond as follows. As a monomer having polymerizable unsaturated bond, an acrylate having an aromatic functional group is preferable in considering adsorption to a transparent substrate and chemical resistance.

Meanwhile, a copolymer, which preferably, an ethylenically unsaturated compound having an epoxy group and more preferably, an ethylenically unsaturated compound having an epoxy group and a hydroxy group is used as a monomer having polymerizable unsaturated bond, can be used in considering heat cure and the improvement of adhesive force between a catalyst pattern layer and a substrate.

As set forth above, an organic high molecular resin constituting the catalyst precursor resin composition of the present invention, that is, a polymer is a copolymer of a monomer having a carboxyl group and a maleimide monomer having a liposoluble functional group substituted to nitrogen, and thus it has a good compatibility with a fluorinated-organic complex of silver ion. The catalyst precursor resin composition has good storage efficiency and stability. The copolymer has not only a good development and pattern property, but also a good chemical resistance. Thus, homogeneous good pattern may be formed even in a strong alkaline state like a formalin copper plating bath. In addition, detach of catalyst or catalyst loss may be minimized in process due to an interaction with a catalyst. As a result, the catalyst pattern layer formed by the catalyst precursor resin composition of the present invention comprising the copolymer has a good stability in the following process.

The copolymer having a weight average molecular weight of 3,000~30,000, preferably 5,000~15,000 may be used. If the weight average molecular weight of the copolymer is less than 3,000, curing is not enough in development and thus, adhesive force is poor and good shape of micro pattern is not easily formed. If the weight average molecular weight of the copolymer is more than 30,000, solubility to development solution becomes low and a quality of pattern thin film is decreased.

A copolymer having acid value of 90~450 milligram (mg) KOH/gram (g), preferably 200~350 milligram (mg) KOH/gram (g) is preferable for forming a micro catalyst pattern. If acid value of the copolymer is less than 90 milligram (mg) KOH/gram (g), compatibility with a catalyst becomes low, and solubility of a catalyst pattern layer to an alkaline development solution becomes low, and then development may become poor. If acid value of the copolymer is more than 450 milligram (mg) KOH/gram (g), solubility to development solution is so high that pattern defect such as disconnection or breakaway may easily occur.

The maleimide monomer having a liposoluble functional group substituted to nitrogen may be used in 5~50 parts by weight, preferably 10~30 parts by weight per 100 parts by weight of all monomer forming a copolymer resin in view of preventing loss of a catalyst and chemical resistance of catalyst pattern. If the content of maleimide monomer having a liposoluble functional group on nitrogen is less than 5 parts by weight, sufficient chemical resistance is not obtained, and thus catalyst pattern may have defect. If the content is more than 50 parts by weight, delicate pattern width is not obtained, and also storage efficiency of composition becomes low.

As a catalyst constituting the catalyst precursor resin composition of the present invention, a fluorinated-organic complex of silver ion may be used in view of stability of catalyst, compatibility with organic solvent, pattern property, development, catalyst loss in wet process like a electroless plating, adhesive force, plating property in electroless state and manufacture cost.

In the case that silver particles are used as catalysts, to disperse catalysts homogeneously in composition is difficult and a stabilizer like a surfactant must be added in a composition because the probability of coagulation is high. In case that silver particles are used in an excess amount, development quality becomes low to form a micro catalyst pattern layer, and adhesive force may become low.

Inorganic silver salts may be dissolved in an aqueous solution, and be lost in development or electroless plating steps. Further, compatibility of an organic solvent and a resin, deposition efficiency of electroless plating and adhesive force of catalyst pattern layer may become low.

A fluorinated-organic complex of silver ion has a poor compatibility with an organic solvent, and thus stability of composition forming catalyst pattern becomes low. Accordingly, when catalyst pattern is formed, homogenous coating and homogenous micro catalyst pattern are not obtainable.

Thus, the catalyst precursor resin composition of the present invention uses a fluorinated-organic complex of silver ion having better stability, adhesive force, and deposition property than an inorganic silver salt as a catalyst precursor.

As a fluorinated-organic complex of silver ion has good compatibility with copolymer and organic solvent, it seems that the catalyst precursor resin composition is stable, very good shape of catalyst pattern may be formed, solubility to water becomes low, and thus loss of catalyst is prevented in wet process. Further, adsorpsive power on a substrate with catalysts of resin composition in electroless plating solution, alkaline aqueous solution may be increased, and thus, a homogeneous deposition film may be obtainable.

Examples of a fluorinated-organic complex of silver ion being able to use in a resin composition of the present invention include, but are not limited only to, silver fluorinated-acetate type, silver fluorinated-sulfonate type, fluoro beta($\beta$)-carbonylketone type silver(I) complex and fluoro beta($\beta$)-carbonylester type silver(I) complex. A fluorinated-organic complex of silver ion selected from the above may be used alone or as a mixture of more than two of the above. specifically, silver(I) fluorosulfate, silver(I) trifluoroacetate, silver (I) trifluoromethansulfate, silver(I) pentafluoropropionate, silver(I) heptafluorobutyrate may be used.

Examples of the fluorinated-organic complex of silver ion include, but are not limited only to, 1,5-cyclooctadien-hexafluoroacetylacetonato silver(I) complex, 1,1,1-trifluoro-2,4-pentanedionatosilver(I) complex, 5,5-dimethyl-1,1,1-trifluoro-2,4-hexanedionatosilver(I) complex, 1-(4-methoxyphenyl)-4,4,4-trifluorobutanedionatosilver(I) complex, 5,5,6,6,7,7,8,8,9,9,10,10,11,11,12,12,12-heptadecafluorodecane-2,4-dionatosilver(I) complex 1,1,1,2,2,3,3-heptafluoro-7,7-dimethyl-4,6-octanedionatosilver(I) complex, 1,1,1,3,5,5,5-heptafluoropentane-2,4-dionatosilver(I) complex, 1,1,1,5,5,5-hexafluoropentane-2,4-dionatosilver(I) complex, 5,5,6,6,7,7,8,8,8-nonafluorooctane-2,4-dionatosilver(I) complex, 5H,5H-perfluorononane-4,6-dionatosilver(I) complex, 6H,6H-perfluoro-undecane-5,7-dionatosilver(I) complex, 8H,8H-perfluoropentadecane-7,8-dionatosilver(I) complex, 6H,6H-perfluorohexane-5,7-dionatosilver(I) complex, 1-phenyl-2H,2H-perfluorohexane-1,3-dionatosilver(I) complex, 1-phenyl-2H,2H-perfluoroundecane-1,3-dionatosilver(I) complex, 5,6,6,6-tetrafluoro-5-(heptafluoropropoxy)hexane-2,4-dionatosilver(I) complex, 1,1,5,5-tetrafluoropentane-2,4 dionatosilver(I) complex, 5,5,6,6,7,7,8,8,9,9,9-undecanefluoro-nonane-2,4-dionatosilver(I) complex, ethyl 3-chloro-4,4,4-trifluoroacetoacetatosilver(I) complex, ethyl-4,4-difluoroacetoacetatosilver(I) complex, ethyl-4,4,4-trifluoroacetoacetatosilver(I) complex, isopropyl-4,4,4-trifluoroacetoacetatosilver(I) complex, methyl-4,4,5,5,5-pentafluoro-3-oxopentanonatosilver(I) complex, ethyl-4,4,5,5,5-pentafluoro-3-oxo-pentanonatosilver(I) complex and 1,1,1,5,5,6,6,6-octafluoro-2,4-hexanedionatosilver(I) complex, and the like. A fluorinated-organic complex of silver ion can be used alone or as a mixture of more than two of the above.

The content of a fluorinated-organic complex of silver ion in catalyst precursor resin composition of the present invention may be used in 2~40 parts by weight, preferably, 5~20 parts by weight per 100 parts by weight of all organic solid in the catalyst precursor resin composition. If the content of a fluorinated-organic complex of silver ion in the resin composition of the present invention is less than 2 parts by weight, the amount of catalysts is not enough, depositing speed becomes remarkably slow in electroless plating, and homogeneous metal thin film may not be formed on a catalyst pattern. On the contrary, if the content of a fluorinated-organic complex of silver ion in the resin composition of the present invention is more than 40 parts by weight, storage efficiency of composition, development efficiency and adhesive force of catalyst pattern becomes low, formation of homogeneous micro catalyst pattern is difficult, and also formation of micro metal thin film on catalyst pattern becomes difficult.

The monomer having multifunctional ethylene-unsaturated bonds constituting the catalyst precursor resin composition of the present invention may be used to promote photo cure, to improve development efficiency, to improve adhesive force, and chemical resistance of catalyst forming layer in electroless plating.

Examples of the monomer having multifunctional ethylene-unsaturated bonds include, but are not limited only to, a compound prepared through esterification of alpha, beta($\alpha$, $\beta$)-unsaturated carboxylic acid and polyhydric alcohol such as ethyleneglycoldiacrylate, ethyleneglycoldimethacrylate, polyethyleneglycol diacrylate, polyethyleneglycol dimethacrylate, trimethylolpropanetriacrylate, trimethylolpropanetrimethacrylate, pentaerythritol triacrylate, pentaerythritol trimethacrylate, pentaerythritol tetraacrylate, pentaerythritol tetramethacrylate, in which numbers of ethylene group are 2~14, propyleneglycoldiacrylate and propyleneglycoldimethacrylate, in which numbers of propylene group are 2~14, dipentaerythritolpentaacrylate, dipentaerythritol pentamethacrylate, dipentaerythritolhexaacrylate, dipentaerythritolhexamethacrylate and the like; a compound prepared by adding acrylic acid or methacrylic acid to a compound containing glycidyl group such as trimethylolpropane triglycidylether acrylic acid adduct, bisphenol A diglycidylether acrylic acid adduct and the like; ester compound of multi carboxylic acid and a compound having a hydroxyl group or an ethylenically unsaturated bond such as phthalic ester of beta($\beta$)-hydroxyethylacrylate or beta($\beta$)-hydroxyethylmathacrylate; adduct of multi polyisocyanate and a compound having a hydroxyl group or an ethylenically unsaturated bond such as toluenediisocyanate adduct of beta($\beta$)-hydroxyethylacrylate or beta($\beta$)-hydroxyethylmathacrylate. The monomer having multifunctional ethylene-unsaturated bonds can be used alone or as a mixture of more than two of the above.

As the monomer having multifunctional ethylene-unsaturated bonds, the monomer having two or more than of an ethylenically unsaturated bond is preferable in view of chemical resistance and adhesive force of micro catalyst pattern and electroless plating.

The content of the monomer having multifunctional ethylene-unsaturated bonds can be 20~150 parts by weight of 100 parts by weight of the copolymer resin. If the content of the monomer having multifunctional ethylene-unsaturated bonds is less than 20 parts by weight, curing is not enough to form micro pattern by a catalyst, and defect such as dissolution and exfoliation may be happened in electroless plating. If the content is more than 150 parts by weight, coating efficiency may be decreased, curing may not be happened to the inside homogenously, and thus catalyst pattern may not be formed.

A photoinitiator constituting the catalyst precursor resin composition which is known as being usable in general in the art may be used. For example, at least one of a photoinitiator selected from a group consisting of acetophenones, benzophenones, Michler benzoylbenzoate, alpha($\alpha$)-amyloximeester, thioxanthones and triazins may be used, but it is not limited only to the above.

Acetophenones include, but are not limited only to, 2-benzyl-2-(dimethylamino)-1-[4-(4-morpholinyl)phenyl]-1-butanone) (IRGACURE 369), alpha,alpha($\alpha,\alpha$)-dimethoxy-alpha($\alpha$)-phenylacetophenone (IRGACURE 651), IRGACURE 1300 (IRGACURE 369 (30 wt %)+IRGACURE 651 (70 wt %)), 1-benzoylcyclo-hexanol (IRGACURE 184), 2,2'-dimethoxy-2-phenyl-acetophenone (DMPA), 2,2-diethoxyacetophenone (DEAP), 4-methylmercapto-alpha,alpha($\alpha,\alpha$)-dimethyl-morpholino acetophenone and the like.

Benzophenones include, but are not limited only to, 1-phenyl-1,2-propanedione-2-O-benzoyloxime (PPO), Ethanone, 1-[9-ethyl-6-(2-methylbenzoyl)-9H-carbazol-3-yl]-1-O-acetyloxime (CGI242).

Thioxanthones include, but are not limited only to, 2-chlorothio-xanthane and 2-isopropylthioxanthane.

Triazins include, but are not limited only to, 3-{4-[2,4-bis(trichloromethyl)-s-triazin-6-yl]phenylthio}propionic acid (TPA).

The photoinitiator may be used in 1 to 25 parts by weight, preferably 5~20 parts by weight per 100 parts by weight of the copolymer resin. If the content of photoinitiator is less than 1 part by weight, catalyst pattern layer is not formed, and thus it is not preferable. If the content of photoinitiator is more than 25 parts by weight, the precision of catalyst pattern layer is decreased, and thus it is not preferable.

Further, if necessary, a photosensitizer may be used in 10 parts by weight or less, preferably 0.1-10 parts by weight per 100 parts by weight of mixed amount of the copolymer and the photoinitiator in the resin composition of the present invention. The photosensitizer may not be limited in its minimum amount as an optional component according to a necessity, but the amount of 0.1 parts by weight or more is preferable to be effective by its addition. If the added amount exceeds 10 parts by weight, the precision of pattern will be decreased, and thus it is not preferable.

Photosensitizer which is known as being usable in general in the art may be used. It includes, but is not limited only to, at least one photosensitizer selected from a group of n-butylamine, triethylamine and tri-n-butylposphine.

Examples of solvent constituting catalyst precursor resin composition include, but are not limited only to, alcohols such as methanol, ethanol, n-propanol, isopropanol, ethyleneglycol and propyleneglycol; ketones such as acetone, methylethylketone, cyclohexanone, and n-methyl-2-pyrrolidone; aromatic carbohydrates such as toluene, xylene, and tetramethylbenzene; glycolethers such as cellosolve, methylcellosolve, ethyl cellosolve, 3-methoxypropylacetate, propyleneglycolmonomethylether, propyleneglycolethylether, dipropyleneglycolmonomethylether, and dipropylene glycolethyl ether; acetates such as ethylacetate, butylacetate, cellosolveacetate, ethyl cel losolveacetate, butylcellosolveacetate, propyleneglycol monomethyletheracetate, and propyleneglycolethylether acetate; amides such as N,N-dimethylacetamide, N,N-dimethylformamide, and acetonitride, and the like.

Further, the catalyst precursor resin composition of the present invention has further optional additives such as a wetting agent, an adhesive promoter, etc., in preparing catalyst precursor resin composition usable in the art.

The catalyst precursor resin composition contains 10~50% by weight of solid content. If the solid content is more than 50% by weight, viscosity becomes high, and thus homogeneous coating may not be accomplished. If solid content is less than 10% by weight, the thickness becomes thinner, mechanical strength of the thin film is decreased, and thus it is not preferable.

As another embodiment of the present invention, a method of forming metallic pattern using metal catalyst precursor resin composition of the present invention is provided. The metallic pattern of the present invention is formed by forming catalyst pattern layer on a substrate using metal catalyst precursor resin composition, reducing the catalyst, and then electroless plating on the reduced catalyst pattern layer.

Transparent substrates, more specifically, glass, plastic sheet or plastic film such as polycarbonate, acryl resin, PET, TAC (triacetyl cellulose), poly vinyl chloride resin, polyamide resin, polyimide resin, and epoxy resin can be preferably used as a substrate to prepare transparent electromagnetic waves-shielding materials. Thickness of substrate, etc. is in general in the art and is not limited.

The catalyst pattern layer is formed by using the catalyst precursor resin composition of the present invention. The catalyst pattern layer is formed by a method of forming pattern (photolithography), offset printing, ink jet printing, imprint or screen printing and the like. Catalyst pattern is preferably formed by a method of forming pattern using exposure and development (photolithography) in order to form very good micro metallic pattern.

For example, in the case that pattern is formed by exposure and development among methods of forming pattern, first, metal catalyst precursor resin film is formed by applying resin composition of the present invention on the substrate. Although a method of applying is not limited, it can be varied depending on the properties of application solution or the amount of the applied. A method of applying may be performed by usual coating such as roll coating, gravure coating, dip coating, bar coating, spray coating, or spin coating.

After that, catalyst pattern is formed by exposure and development of the coated metal catalyst precursor resin layer. The exposure and development processes can be carried out by known methods. For example, as an exposure process, a mask having exposure pattern may be used for exposure in a contact or noncontact exposure way. Common light source such as halogen lamp, high pressure mercury lamp, a metal halide lamp can be used as a light source in an exposure process. The development can be carried out by spray or dipping.

The catalyst pattern can be formed by offset printing, ink jet printing, imprint or screen printing as the above. The formed catalyst layer pattern has, but is not limited only to, 30 micrometer ($\mu$m) or less of line width, preferably 20 micrometer (μm) or less of line width. In addition, the catalyst precursor resin composition of the present invention can be applied to form a micro pattern having 10 micrometer (μm) or less of line width. After exposure and development processes, the catalyst pattern having 60% and more, more preferably 70% and more of space ratio without pattern (aperture ratio) is proper.

As mentioned above, a fluorinated-organic complex of silver ion precursor may be reduced to improve electroless plating performance after forming catalyst pattern.

The reduction of a fluorinated-organic complex of silver ion precursor may be carried out by any method being applicable in the art in general, for example, it may be reduced by using reductant, or by treating with heat and/or UV exposure.

In the case that reductant is used, any reductant generally known in the art may be used, for example, sodium boranehydride ($NaBH_4$) or ascorbic acid aqueous solution may be used.

Meanwhile, a fluorinated-organic complex of silver ion precursor can be voluntarily reduced by electroless plating solution in electroless plating depending on its kinds, but the reduction by electroless plating solution is not enough, in this case, reduction process of a fluorinated-organic complex of silver ion precursor is needed.

Reductant aqueous solution having about 0.01-1.0 mol (M) of concentration is preferably used. If the concentration of reductant aqueous solution is less than 0.01 mol (M), reduction efficiency is not enough, and an organic complex of silver ion may not be reduced enough. If the concentration is more than 1.0 mol (M), it is difficult to control the degree of reduction, and catalyst pattern layer might be damaged. Reductant aqueous solution may be applied by spray or dipping.

Reduction method using UV exposure or heat is not wet process, and thus it is preferable in view of preventing loss of catalyst. In particular, catalyst is activated by UV exposure, a fluorinated-organic complex of silver ion of the present invention is more preferably reduced by UV exposure.

Pre-baking between coating and photo-masking and/or post-bake after development may be optionally carried out in forming a catalyst pattern layer. This process is general in the art, and may be carried out depending on the necessity, it is not intended to limit the present invention.

As mentioned above, metallic pattern is formed by forming catalyst pattern layer on a substrate using catalyst precursor resin composition of the present invention, reducing it, and electroless plating on the reduced catalyst pattern layer. Electroless plating is not specifically limited, but it may be carried out by any electroless plating method known in the art. Copper plating or silver plating may be carried out in the present invention, and copper plating is desirable in view of price and shielding performance of electromagnetic waves.

Electroless copper plating is carried out by using a conventionally known plating solution, it is not limited, but may be carried out by using known plating solution containing metal ion salts such as copper sulfate, reductant such as formalin, chelator such as EDTA and trace amount of other additives.

Advantageous Effects

As set forth above, in a final shielding layer of electromagnetic waves containing metallic pattern formed, entire thickness of a catalyst pattern layer and a metal layer can be controlled by metal salts or metal ion concentration in plating bath, plating temperature, deposit time and the like.

The thickness of catalyst pattern layer and/or metal layer may be varied depending on width of the pattern. Those skilled in the art can control the thickness of catalyst pattern layer and/or metal layer to get proper thickness. Entire thickness of catalyst pattern layer and metal layer may be 0.3 micrometer (μm) or more, preferably 0.5 micrometer (μm) or more, more preferably 1 micrometer (μm) or more, more preferably 1-8 micrometer (μm), but it is not limited only to the above. If the entire thickness of catalyst pattern layer and metal layer is less than 0.3 micrometer (μm), mechanical strength may not be enough, and conductivity may not be enough to give shielding performance. If the entire thickness of catalyst pattern layer and metal layer is more than 8 micrometer (μm), the thickness is too thick to progress to post-processing. Further, the entire thickness of catalyst pattern layer and metal layer which is at least 0.1 micrometer (μm) (100 nanometer (nm)) may be preferable in considering conductivity and electromagnetic waves-shielding property and the like.

As set forth above, the metallic pattern of the present invention may be formed by using the catalyst precursor resin composition which includes a copolymer composed of a monomer having a carboxyl group and a maleimide monomer having a liposoluble functional group on nitrogen and a fluorinated-organic complex of silver ion, and thus the catalyst pattern layer has a good adhesive force, less loss of catalyst during wet process such as development or plating process, improved depositing speed to form homogeneous micro metallic pattern by electroless plating.

As the metallic pattern obtained according to the present invention has a good electromagnetic waves-shielding performance, it is suitable to be used as materials for shielding electromagnetic waves occurred on entire display such as CRT, PDP, liquid crystal, EL and the like, an electric and/or electronic component or element containing metallic pattern, specially EMI film for PDP, and a flexible print circuit board wiring.

BEST MODE

Figure 1:
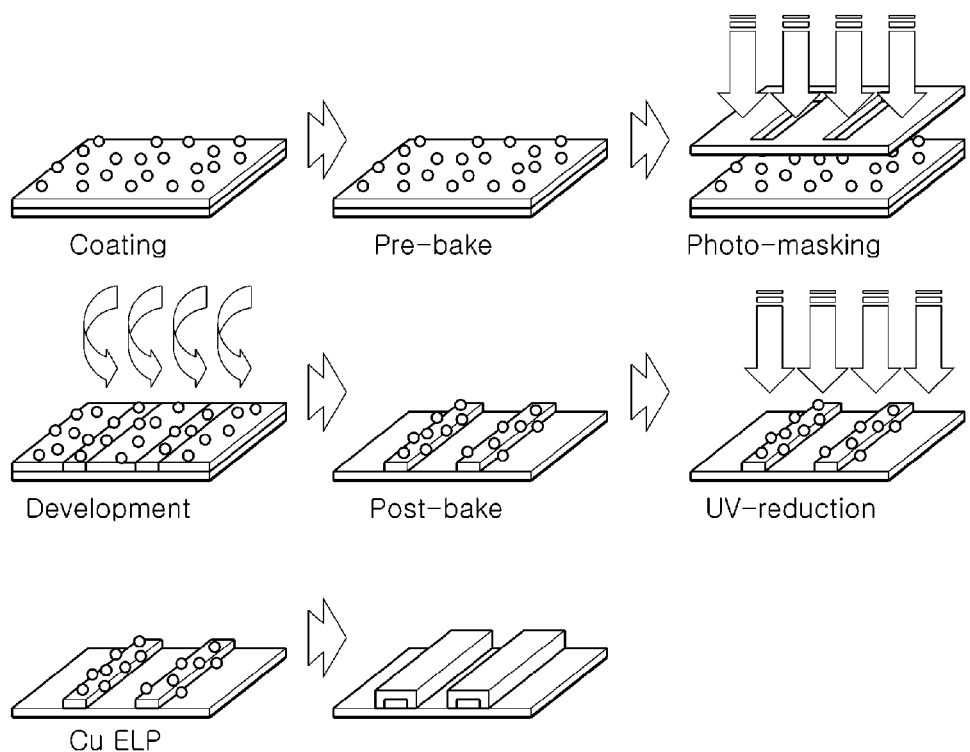
FIG. 1 is a process flow of forming a micro copper thin film using a photomask process according to an aspect of the invention.

The following non-limiting examples are used to further describe or illustrate the invention. The examples are given for illustration of the invention and are not intended to be limiting thereof.

EXAMPLES

Example 1

A. Preparation of an Organic Polymer

In 250 milliliter (mL) flask, 5.0 gram (g) of MMA (methyl mathacrylate), 3.0 gram (g) of NPMI (N-phenyl maleimide), 8.0 gram (g) of MAA (methyl methacrylic acid), 2.0 gram (g) of BzMA (benzyl mathacrylate), and 2.0 gram (g) of styrene were dissolved in 60.33 gram (g) of a mixed solvent (weight ratio of 1:1) of 3-MBA (3-methoxybutylacetate) and DPM (dipropyleneglycol monomethyl ether) (hereafter, it is referred to as 'a mixed solvent of 3-MBA and DPM') at room temperature, and then 0.4 gram (g) of 3-MPA (3-mercaptopropionic acid) was added to the solution with stirring at 500 rpm. The mixed solution was warmed to 60 centigrade (° C.) under nitrogen atmosphere, and stirred for an hour. Then, a solution of 0.6 gram (g) of V-65 (2,2'-azobis(2,4-dimethyl valeronitryl) dissolved in 5.0 gram (g) of a mixed solvent of 3-MBA and DPM was added to the mixed solution at 60 centigrade (° C.) and reacted for 4 hours at 60 centigrade (° C.). The acid value of the obtained organic polymer resin was 292.23 milligram (mg) KOH/gram (g), and the weight average molecular weight was 8,616.

B. Preparation of a Catalyst Precursor Resin Composition 28.7055 gram (g) of polymer solution obtained from the above A step, 12.5006 gram (g) of DPHA (dipentaerythritol hexa-acrylate) solution (50 weight percent (wt %) in PGMEA), 0.8651 gram (g) of photoinitiator IRGA-CURE2010 (alpha(α)-Hydroxyketone), 1.2856 gram (g) of silver trifluoroacetate (AgO$_2$CCF$_3$), 0.2093 gram (g) of KBM 503 as an adhesive promoter, 0.2417 g of 10 wt % BYK 331 (BYK-Chemi co.) MEK solution as a wetting agent, and 26.1921 gram (g) of MEK (methylethylketone) as an additional solvent were mixed at room temperature, and stirred at 500 rpm using an agitator to obtain 70.0000 gram (g) of catalyst precursor resin composition. The composition prepared in this Example had 23.17 weight percent (wt %) of solid content.

C. Forming of Micro Metallic Pattern

Metallic pattern was formed by using the prepared catalyst precursor resin composition under the condition and processing procedures illustrated in FIG. 1.
(1) Coating: The catalyst precursor resin composition prepared in the above step B was bar coated in 750 nanometer (nm) thickness on PET film having 100 micrometer (um) of thickness by using Gap size 10 micrometer (μm) Meyer bar to form a catalyst pattern.
(2) Pre-bake: After bar coating, pre-baked for 90 seconds at 100 centigrade (° C.).
(3) Exposure: About 375 nanometer (nm) wavelength of ultraviolet ray was illuminated in 195 millijoule (mJ)/square centimeter (cm2) energy through a photomask (20 micrometer (μm) mesh pattern) using contact way to exposure the catalyst pattern.
(4) Development: ECD-100 (pH 13, an alkaline aqueous solution, ENF Co.) was sprayed on the exposed catalyst pattern for 144 seconds by spraying, super pure (DI) was used for washing, and nitrogen was blown for development.
(5) Post-bake: after development, post-baked for 300 seconds at 100 centigrade (° C.).
(6) Reduction: An ultraviolet ray within the region of 330~500 nanometer (nm) wavelength was illuminated in 3.6 Joule (J)/square centimeter (cm2) energy on the post-baked catalyst pattern to reduce catalyst metal.
(7) Copper electroless plating: It was carried out by using Covertron Copper Bath (ATOTECH company) at 60 centigrade (° C.) for 10 minutes to form a plating layer having 1 micrometer (μm) of thickness.

Figure 2:
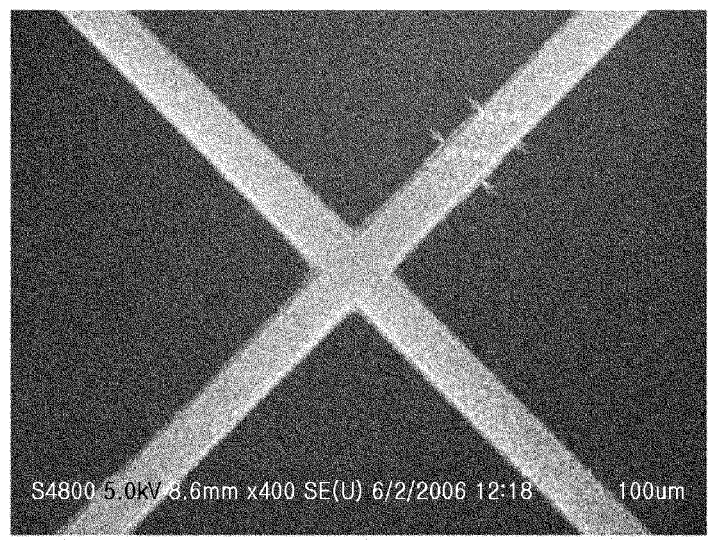
FIG. 2 is an optical microphotograph (magnification ×400) of a catalyst pattern formed in Example 1.
Figure 3:
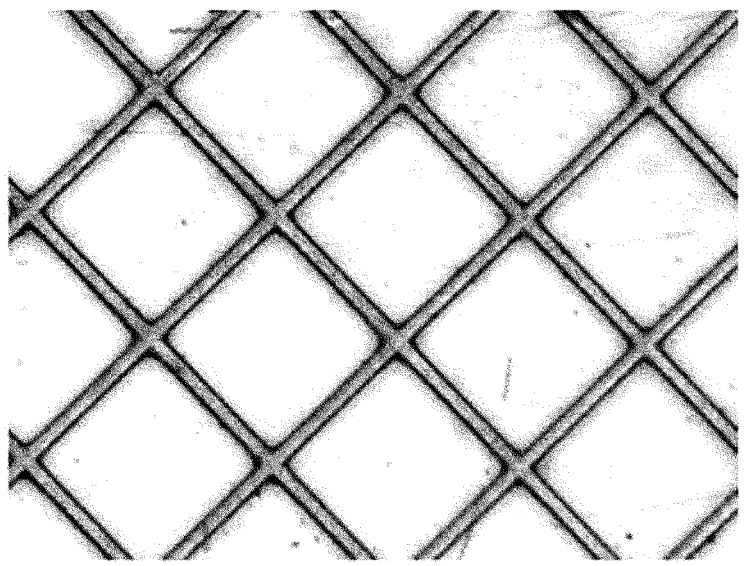
FIG. 3 is an optical microphotograph (magnification ×50) of metallic pattern formed in Example 1.

The optical microphotograph of the catalyst pattern formed in this Example was illustrated in FIG. 2, and the optical microphotograph of the metallic pattern was illustrated in FIG. 3, and the line width of the metallic pattern formed in this Example was 20 micrometer (μm).

Example 2

A. Preparation of an Organic Polymer

In 250 milliliter (mL) of flask, 3.0 gram (g) of MMA (Methyl methacrylate), 3.0 gram (g) of NPMI (N-Phenyl maleimide), 6.0 gram (g) of MAA (Methyl methacrylic acid), 2.0 gram (g) of BzMA (Benzyl methacrylate), and 2.0 gram (g) of styrene were dissolved in 60.33 gram (g) of a mixed solvent of 3-MBA and DPM at room temperature, and then 0.4 gram (g) of 3-MPA (3-mercapto propionic acid) was added to the solution with stirring at 500 rpm. The mixed solution was warmed to 60 centigrade (° C.) for an hour with stirring at 500 rpm under nitrogen atmosphere. A solution of 0.6 gram (g) of V-65 dissolved in 5.0 gram (g) of a mixed solvent of 3-MBA and DPM was added to the mixed solution at 60 centigrade (° C.), and reacted for 4 hours at 60 centigrade (° C.). The acid value of the obtained organic polymer resin was 222.37 milligram (mg) KOH/gram (g), and the weight average molecular weight was 9,314.

B. Preparation of Catalyst Precursor Resin Composition

The catalyst precursor resin composition was prepared by the same method as the preparation of the catalyst precursor resin composition in Example 1, except that the organic polymer resin prepared in Example 2, step A was used. The solid content of the composition prepared in this Example was 23.17 weight percent (wt %).

C. Forming of Micro Metallic Pattern

The catalyst micro metallic pattern was prepared by the same method as the preparation of the micro metallic pattern in Example 1, except that the catalyst precursor resin composition prepared in Example 2, step B was used.

Example 3

A. Preparation of Organic Polymer

In 250 milliliger (mL) flask, 5.0 gram (g) of MMA, 4.0 gram (g) of NPMI, 7.0 gram (g) of MAA, 2.0 gram (g) of BzMA, and 2.0 gram (g) of styrene were resolved in 60.33 gram (g) of a mixed solvent of 3-MBA and DPM at room temperature, and then 0.4 gram (g) of 3-MPA was added to the solution with stirring at 500 rpm. The mixed solution was warmed to 60 centigrade (° C.) under nitrogen atmosphere for an hour with stirring. A solution of 0.6 gram (g) of V-65 dissolved in 5.0 gram (g) of a mixed solvent of 3-MBA and DPM was added in the mixed solution at 60 centigrade (° C.) and reacted for 4 hours at 60 centigrade (° C.). The acid value of the obtained organic polymer resin was 241.60 milligram (mg) KOH/gram (g), and the weight average molecular weight was 8,670. Solid content of the composition prepared in this Example was 23.17 weight percent (wt %).

B. Preparation of Catalyst Precursor Resin Composition

The catalyst precursor resin composition was prepared by the same method as the preparation of the catalyst precursor resin composition in Example 1, except that the organic polymer resin prepared in Example 3, step A was used.

C. Forming of Micro Metallic Pattern

The catalyst micro metallic pattern was prepared by the same method as the preparation of the micro metallic pattern in Example 1, except that the catalyst precursor resin composition prepared in Example 3, step B was used.

Comparative Example 1

A. Preparation of Organic Polymer Resin

An organic polymer solution was prepared by the same method as in Step A, Example 1.

B. Preparation of a Catalyst Precursor Resin Composition 28.7055 gram (g) of organic polymer resin solution prepared in Comparative Example 1, step A was mixed with 12.5006 gram (g) of DPHA solution (50 weight Percent (wt %) in PGMEA), 0.8651 gram (g) of photoinitiator IRGACURE2010, 1.2856 gram (g) of silveracetylacetonate ([$CH_3COCH=C(O^-)CH_3$]Ag), 0.2093 gram (g) of KBM 503 as an adhesive promoter, 0.2417 gram (g) of MEK solution of 10 weight percent (wt %) BYK 331 as a wetting agent, and 26.1921 gram (g) of MEK as an additional solvent at room temperature, and stirred using an agitator to obtain 70.0000 gram (g) of catalyst precursor resin composition.

C. Forming of Micro Metallic Pattern

Figure 4:
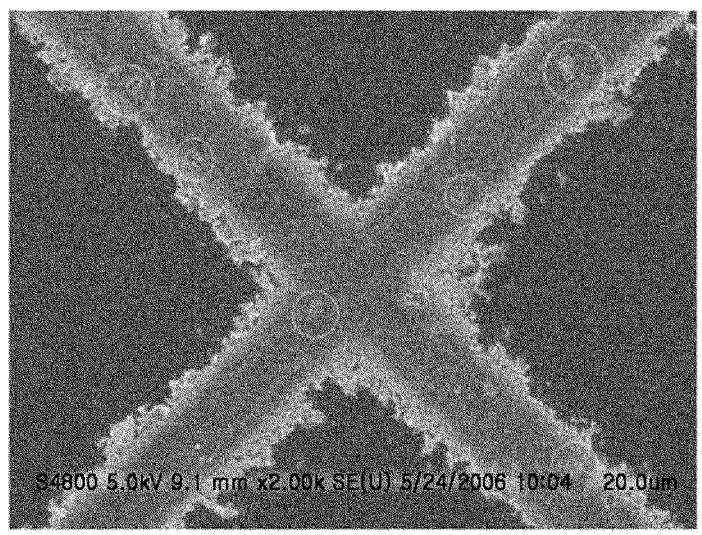
FIG. 4 is an optical microphotograph (magnification ×2000) of a catalyst pattern formed in Comparative Example 1.

The catalyst micro metallic pattern was prepared by the same method as the preparation of the micro metallic pattern in Example 1, except that the catalyst precursor resin composition prepared in Comparative Example 1, step B was used and 5 micrometer (μm) of mesh pattern during exposure. The catalyst pattern was illustrated in FIG. 4, the line width was 5 micrometer (μm).

Comparative Example 2

A. Preparation of Organic Polymer

In 250 mL flask, 8.0 gram (g) of MMA, 8.0 gram (g) of MAA, 2.0 gram (g) of BzMA, and 2.0 gram (g) of styrene were dissolved in 60.33 gram (g) of a mixed solvent of 3-MBA and DPM at room temperature, and then 0.4 gram (g) of 3-MPA was added to the solution with stirring at 500 rpm. The mixed solution was warmed to 60 centigrade (° C.) under nitrogen atmosphere for an hour with stirring at 500 rpm. A solution of 0.6 gram (g) of V-65 dissolved in 5.0 gram (g) of a mixed solvent of 3-MBA and DPM was added to the mixed solution at 60 centigrade (° C.) and reacted for 4 hours at 60 centigrade (° C.). The acid value of the obtained organic polymer resin was 295.09 milligram (mg) KOH/gram (g), and the weight average molecular weight was 10,514.

B. Preparation of Catalyst Precursor Resin Composition

The catalyst precursor resin composition was prepared by the same method as the preparation of the catalyst precursor resin composition in Example 1, except that the organic polymer resin prepared in Comparative Example 2, step A was used.

C. Forming of Micro Metallic Pattern

Figure 5:
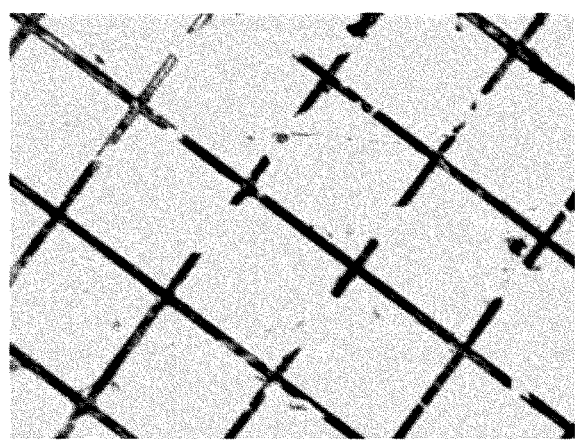
FIG. 5 is an optical microphotograph (magnification ×50) of metallic pattern formed in Comparative Example 2.

The catalyst micro metallic pattern was formed by the same method as the preparation of the micro metallic pattern in Comparative Example 1, except that the catalyst precursor resin composition prepared in Comparative Example 2, step B was used. The catalyst pattern was illustrated in FIG. 5.

Comparative Example 3

A. Preparation of Organic Polymer

In 250 mL flask, 5.0 gram (g) of MMA, 3.0 gram (g) of NPMI, 8.0 gram (g) of MAA, 2.0 gram (g) of BzMA, and 2.0 gram (g) of styrene were dissolved 60.33 gram (g) of a mixed solvent of 3-MBA and DPM at room temperature, and 1.2 gram (g) of 3-MPA was added to the solution with stirring at 500 rpm. The mixed solution was warmed to 60 centigrade (° C.) under nitrogen atmosphere for an hour with stirring at 500 rpm. A solution of 0.6 gram (g) of V-65 dissolved in 5.0 gram (g) of a mixed solvent of 3-MBA and DPM was added to the mixed solution at 60 centigrade (° C.) and reacted for 4 hours at 60 centigrade (° C.). The acid value of the obtained organic polymer resin was 279.44 milligram (mg) KOH/gram (g), and the weight average molecular weight was 2,402.

B. Preparation of Catalyst Precursor Resin Composition

The catalyst precursor resin composition was prepared by the same method as the preparation of the catalyst precursor resin composition in Example 1, except that the organic polymer resin prepared in Comparative Example 3, step A was used.

C. Forming of Micro Metallic Pattern

Figure 6:
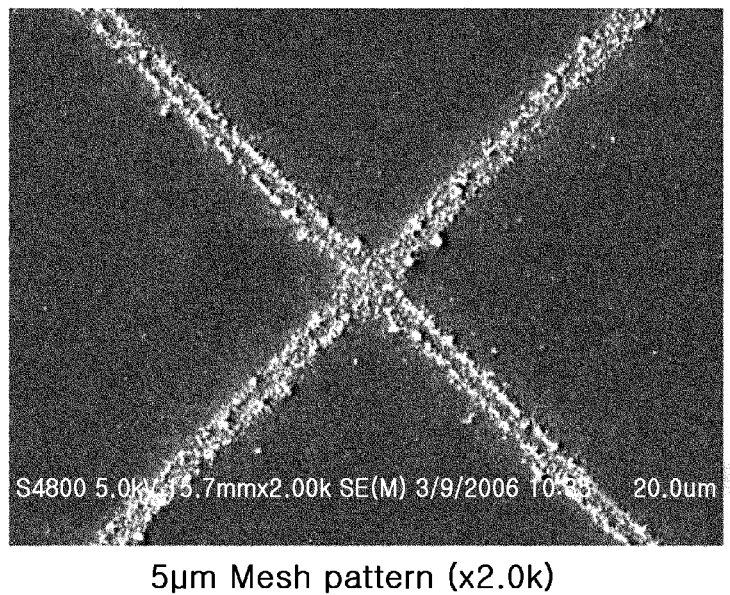
FIG. 6 is an optical microphotograph (magnification ×2000) of a catalyst pattern formed in Comparative Example 3.

The catalyst micro metallic pattern was formed by the same method as the preparation of the micro metallic pattern in Comparative Example 1, except that the catalyst precursor resin composition prepared in Comparative Example 3, step B was used. The catalyst pattern was illustrated in FIG. 6, the line width was 5 μm.

Comparative Example 4

A. Preparation of Organic Polymer

In 250 mL flask, 1.0 gram (g) of MMA, 3.0 gram (g) of NPMI, and 16.0 gram (g) of MAA were dissolved in 60.33 gram (g) of a mixed solvent of 3-MBA and DPM, and then 0.4 gram (g) of 3-MPA was added with stirring. The mixed solution was warmed to 60 centigrade (° C.) under nitrogen atmosphere for an hour with stirring at 500 rpm. A solution of 0.6 gram (g) of V-65 dissolved in 5.0 gram (g) of a mixed solvent of 3-MBA and DPM was added to the mixed solution at 60 centigrade (° C.) and reacted for 4 hours at 60 centigrade (° C.). The acid value of the obtained organic polymer resin was 579.69 milligram (mg) KOH/gram (g), and the weight average molecular weight was 4,302.

B. Preparation of a Catalyst Precursor Resin Composition

The catalyst precursor resin composition was prepared by the same method as the preparation of the catalyst precursor resin composition in Example 1, except that the organic polymer resin prepared in Comparative Example 4, step A was used.

C. Forming of Micro Metallic Pattern

Figure 7:
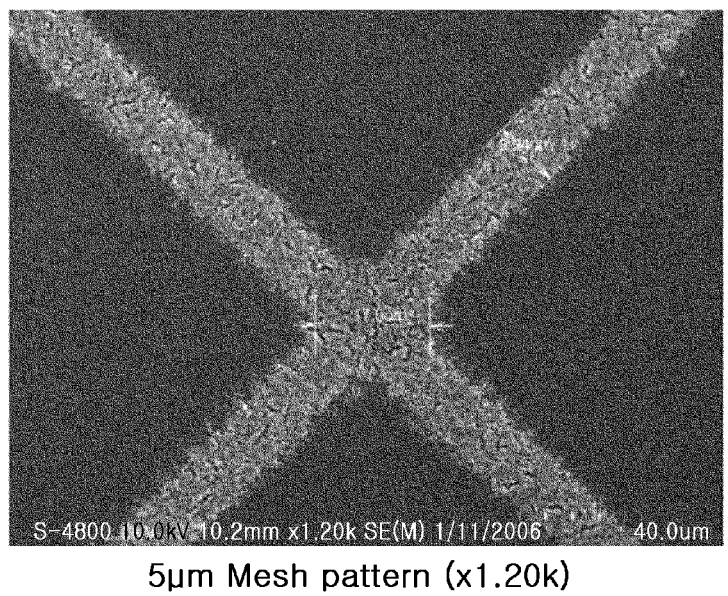
FIG. 7 is an optical microphotograph (magnification ×1200) of a catalyst pattern formed in Comparative Example 4.

The catalyst micro metallic pattern was formed by the same method as the preparation of the micro metallic pattern in Comparative Example 1, except that the catalyst precursor resin composition prepared in Comparative Example 4, step B was used. The catalyst pattern was illustrated in FIG. 7, the line width was 5 μm.

Example 4

In this Example, the coating property and development property of the catalyst pattern formed in Examples 1 to 3 and Comparative Examples 1 to 4, and copper plating property of the metallic pattern were evaluated, and then the results were represented in Table 1.

A. Evaluation of Coating Property

The coating layer (thin film) of catalyst precursor resin composition formed on PET film in Examples 1 to 3 and Comparative Examples 1 to 4 was evaluated about coating property with naked eyes.

It was evaluated as 'good' in the case that catalyst precursor resin composition coating layer (thin film) was homogeneous and transparent, and 'normal'?in the case that the thin film was homogeneous, but not transparent.

B. Evaluation of Development Property

Catalyst pattern layer formed on PET film at the state before copper electroless plating in the Examples 1 to 3 and Comparative Examples 1 to 4 was evaluated for development property about whether catalyst pattern layer was formed homogeneously or not, and with or without of defect of the catalyst pattern such as disconnection of catalyst pattern, the undeveloped and the existence of residue and the like through FESEM (Hitachi S-4800).

It was evaluated as 'good' in the case that there is no defect on catalyst pattern and the catalyst pattern was homogeneous, 'insufficient' in the case that there is no defect on catalyst pattern and the thin film of the catalyst pattern was inhomogeneous, and 'not good' in the case that there is a defect on catalyst pattern.

C. Evaluation of Copper Electroless Plating Property

The copper plating property was evaluated by observing with or without of defect of the copper pattern formed in Examples 1 to 3 and Comparative Examples 1 to 4, such as disconnection of copper patterns, delamination of between entire copper pattern and PET film, plating condition of other parts of copper pattern with optical microscope.

It was evaluated as 'good' in the case that copper plating was formed and there is no defect on copper pattern, 'insufficient' in the case that copper plating was formed but there is a defect on copper pattern, and 'not good' in the case that copper plating was not formed.

TABLE 1

| | Coating Property | Development Property | copper plating property |
|---|---|---|---|
| Example 1 | Good | Good | Good |
| Example 2 | Good | Good | Good |
| Example 3 | Good | Good | Good |
| Comparative Example 1 | Good | Insufficient | Insufficient |
| Comparative Example 2 | Good | Good | Insufficient |
| Comparative Example 3 | Good | not good | not good |
| Comparative Example 4 | Normal | not good | not good |

It was found that, by comparing Example 1 and Comparative Example 1, the metallic pattern having good coating thin film and reproducibility was formed due to compatibility with copolymer and organic solvent in Example 1 using fluorinated-organic complex of silver ion.

Further, comparing to Comparative Example 2, which did not use maleimide having aromatic functional group on nitrogen, in Examples of the present invention which uses copolymer comprising maleimide having aromatic functional group on nitrogen, catalyst pattern having good chemical resistance and/or attach property was formed, and copper pattern having adsorpsive power was also formed homogeneously.

It was found that a good copper thin film was formed in spite of composition variation of monomers from Examples 2 and 3. Even though the maleimide having aromatic functional group on nitrogen was used in Comparative Examples 3 and 4, if Mw or Av value was out of the ranges of the present invention, the catalyst precursor resin composition was not found to be good itself.

It was found that, in the catalyst pattern and metallic pattern formed in Examples 1 to 3 according to the present invention, the less acid value the copolymer had within the ranges of the present invention, the better catalyst pattern and metallic pattern was formed. (acid value: Example 2<Example 3<Example 1)

INDUSTRIAL APPLICABILITY

By forming metallic pattern using the catalyst precursor resin composition of the present invention, adhesive force of the formed catalyst layer is good, catalyst loss is less in wet process such as development or plating process, depositing speed is improved, and thus homogeneous micro metallic pattern may be formed after electroless plating. The metallic pattern of the present invention is suitable for using in electric or electronic articles, and particularly may be used as shielding materials of electromagnetic waves occurred in front of display such as CRT, PDP, liquid crystal, EL and the like, or for forming wiring of flexible print circuit board.

The invention claimed is:

1. A catalyst precursor resin composition for forming metallic pattern, comprising:
   (a) a copolymer of a monomer having a carboxyl group and a maleimide monomer having a liposoluble functional group on nitrogen;
   (b) a fluorinated-organic complex of a silver ion;
   (c) a monomer having multifunctional ethylene-unsaturated bonds;
   (d) a photoinitiator; and
   (e) an organic solvent.

2. The catalyst precursor resin composition of claim 1, wherein said monomer having a carboxyl group is at least one selected from the group consisting of acrylic acid, methacrylic acid, crotonic acid, itaconic acid, maleinic acid, fumarinic acid, monomethylmaleinic acid, isoprenesulphonic acid, styrenesulphonic acid and 5-norbonene-2-carboxylic acid.

3. The catalyst precursor resin composition of claim 1, wherein said maleimide monomer having a liposoluble functional group on nitrogen is at least one selected from the group consisting of N-ethylmaleimide, N-propylmaleimide, N-methoxycarbonylmaleimide, N-furfurylmaleimide, N-cyclohexylmaleimide, N-butylmaleimide, 2,5-dioxo-3-pyrroline-1-carboxamide, 3,4-dichloromethyl-pyrrole-2,5-dione, N-benzylmaleimide, N-phenylmaleimide, 3-methyl-N-phenylmaleimide, N-(ortho-toyl)-N-phenylmaleimide, N-(4-fluorophenyl)maleimide, N-(2,6-xylyl)maleimide, 3-chloro-1-phenyl-pyrrole-2,5-dione, N-(2-chlorophenyl)-maleimide, N-(1-napthalyl)-maleimide and 1-(2-trifluoromethyl-phenyl)-pyrrole-2,5-dione.

4. The catalyst precursor resin composition of claim 3, wherein said maleimide monomer having a liposoluble functional group on nitrogen is a maleimide monomer having an aromatic functional group on nitrogen.

5. The catalyst precursor resin composition of claim 1, wherein said copolymer has a weight average molecular weight ranging from 3,000 to 30,000.

6. The catalyst precursor resin composition of claim 1, wherein said copolymer has an acid value ranging from 90 milligram (mg) KOH/gram (g) to 450 milligram (mg) KOH/gram (g).

7. The catalyst precursor resin composition of claim 1, wherein said copolymer comprises said maleimide monomer having a liposoluble functional group on nitrogen in 5 to 50 parts by weight per 100 parts by weight of total monomers.

8. The catalyst precursor resin composition of claim 1, wherein said fluorinated-organic complex is at least one selected from the group consisting of a silver fluorinated-acetate type complex, a silver fluorinated-sulfonate type complex, a fluoro beta($\beta$)-carbonylketone type silver(I) complex and a fluoro beta($\beta$)-carbonylester type silver(I) complex.

9. The catalyst precursor resin composition of claim 8, wherein said fluorinated-organic complex is one selected from the group consisting of 1,5-cyclooctadien-hexafluoroacetylacetonatosilver(I) complex, 1,1,1-trifluoro-2,4-pentanedionatosilver(I) complex, 5,5-dimethyl-1,1,1-trifluoro-2,4-hexanedionenatesilver(I) complex, 1-(4-methoxyphenyl)-4,4,4-trifluorobutanedionatosilver(I) complex, 5,5,6,6,7,7,8,8,9,9,10,10,11,11,12,12,12-heptadecafluorodecane-2,4-dionatosilver(I) complex 1,1,1,2,2,3,3,-heptafluoro-7,7-dimethyl-4,6-octanedionatosilver(I) complex, 1,1,1,3,5,5,5-heptafluoropentane-2,4-dionatosilver(I) complex, 1,1,1,5,5,5-hexafluoropentane-2,4-dionatosilver(I) complex, 5,5,6,6,7,7,8,8,8-nonafluorooctane-2,4-dionatosilver(I) complex, 5H,5H-perfluorononane-4,6-dionatosilver(I) complex, 6H,6H-perfluoro-undecane-5,7-dionatosilver(I) complex, 8H,8H-perfluoropentadecane-7,8-dionatosilver(I) complex, 6H,6H-perfluoroundecane-5,7-dionatosilver(I) complex, 1-phenyl-2H,2H-perfluorohexane-1,3-dionatosilver(I) complex, 1-phenyl-2H,2H-perfluoroundecane-1,3-dionatosilver(I) complex, 5,6,6,6-tetrafluoro-5-(heptafluoropropoxy)hexane-2,4-dionatosilver(I) complex, 1,1,5,5-tetrafluoropentane-2,4 dionatosilver(I) complex, 5,5,6,6,7,7,8,8,9,9-undecanefluoro-nonane-2,4-dionatosilver(I) complex, ethyl 3-chloro-4,4,4-trifluoroacetoacetatosilver(I) complex, ethyl-4,4-difluoroacetoacetatosilver(I) complex, ethyl-4,4,4-trifluoroacetoacetatosilver(I) complex, isopropyl-4,4,4-trifluoroacetoacetatosilver(I) complex, methyl-4,4,5,5,5-pentafluoro-3-oxopentanonatosilver(I) complex, ethyl-4,4,5,5,5-pentafluoro-3-oxo-pentanonatosilver(I) complex and 1,1,1,5,5,6,6,6-octafluoro-2,4-hexanedionatosilver(I) complex.

10. The catalyst precursor resin composition of claim 1, comprising said fluorinated-organic complex in 2 parts to 40 parts by weight per 100 parts by weight of organic solid parts of the catalyst precursor resin composition.

11. The catalyst precursor resin composition of claim 1, wherein said monomer having multifunctional ethylene-unsaturated bonds is at least one selected from the group consisting of (1) a compound prepared through esterification of alpha, beta($\alpha,\beta$)-unsaturated carboxylic acid and polyhydric alcohol; (2) a compound prepared by adding acrylic acid or methacrylic acid to a compound containing glycidyl group; (3) an ester compound of multi carboxylic acid and a compound having a hydroxyl group or an ethylenically unsaturated bond; and (4) an adduct of multi polyisocyanate and a compound having a hydroxyl group or an ethylenically unsaturated bond.

12. The catalyst precursor resin composition of claim 11, wherein said multifunctional monomer having an unsaturated ethylene bond has at least two functional groups of an unsaturated ethylene bond.

13. The catalyst precursor resin composition of claim 1, comprising said monomer having multifunctional ethylene-unsaturated bonds in 20 parts to 150 parts by weight per 100 parts by weight of the copolymer.

14. The catalyst precursor resin cap of claim 1, wherein the compound (1) is at least one selected from the group consisting of ethyleneglycoldiacrylate, ethyleneglycoldimethacrylate, polyethyleneglycol diacrylate, and polyethyleneglycol dimethacrylate, trimethylolpropanetriacrylate, trimethylolpropane trimethacrylate, pentaerythritoltriacrylate, pentaerythritol trimethacrylate, pentaerythritoltetraacrylate, pentaerythritol tetramathacrylate, (in which numbers of ethylene group are 2 to 14), propyleneglycoldiacrylate, propyleneglycoldimethacrylate, (in which numbers of propylene group are 2 to 14), dipentaerythritolpentaacrylate, dipentaerythritolpentamathacrylate, dipentaerythritolhexaacrylate, and dipentaerythritolhexamathacrylate; wherein the compound (2) is at least one selected from the group consisting of trimethylolpropane triglycidyletheracrylic acid adduct and bisphenol A diglycidyletheracrylic acid adduct; wherein the compound (3) is a phthalic ester of beta($\beta$)-hydroxyethylacrylate or beta($\beta$)-hydroxyethylmathacrylate; and wherein the compound of (4) is a toluenediisocyanate adduct of beta($\beta$)-hydroxyethylacrylate or beta($\beta$)-hydroxyethylmathacrylate.

* * * * *